(12) United States Patent
Sakurai et al.

(10) Patent No.: US 10,707,300 B2
(45) Date of Patent: Jul. 7, 2020

(54) SEMICONDUCTOR DEVICE

(71) Applicant: FUJI ELECTRIC CO., LTD., Kanagawa (JP)

(72) Inventors: Yosuke Sakurai, Azumino (JP); Yuichi Onozawa, Matsumoto (JP); Akio Nakagawa, Chigasaki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/281,002

(22) Filed: Feb. 20, 2019

(65) Prior Publication Data

US 2019/0312101 A1    Oct. 10, 2019

(30) Foreign Application Priority Data

Apr. 4, 2018   (JP) .................. 2018-072790

(51) Int. Cl.
*H01L 29/06* (2006.01)
*H01L 29/739* (2006.01)
*H01L 29/08* (2006.01)
*H01L 29/10* (2006.01)

(52) U.S. Cl.
CPC ........ *H01L 29/063* (2013.01); *H01L 29/0638* (2013.01); *H01L 29/0834* (2013.01); *H01L 29/1095* (2013.01); *H01L 29/7397* (2013.01)

(58) Field of Classification Search
CPC ............ H01L 29/1095; H01L 29/7397; H01L 29/063–0638; H01L 29/0834
See application file for complete search history.

(56) References Cited

U.S. PATENT DOCUMENTS

2007/0267663 A1* 11/2007 Harada ............... H01L 29/0834
                                                         257/288
2008/0197379 A1   8/2008 Aono

FOREIGN PATENT DOCUMENTS

| JP | 2007311627 A | 11/2007 |
| JP | 2008205015 A | 9/2008 |
| JP | 2010114136 A | 5/2010 |

* cited by examiner

*Primary Examiner* — Daniel P Shook

(57) ABSTRACT

A semiconductor device having a trench gate structure is provided. A semiconductor device is provided, including: a first-conductivity-type drift region provided in a semiconductor substrate; a first-conductivity-type accumulation region provided above the drift region and having a higher doping concentration than the drift region; a second-conductivity-type base region provided above the accumulation region; and an electric-field relaxation layer provided between the accumulation region and the base region and having a lower doping concentration than the accumulation region. The electric-field relaxation layer may include a first-conductivity-type region including a region having a same doping concentration as the drift region.

19 Claims, 11 Drawing Sheets

US 10,707,300 B2

SEMICONDUCTOR DEVICE

The contents of the following Japanese patent application(s) are incorporated herein by reference:
NO. 2018-072790 filed in JP on Apr. 4, 2018.

BACKGROUND

1. Technical Field

The present invention relates to a semiconductor device.

2. Related Art

Conventionally, semiconductor devices, such as IGBTs (Insulated Gate Bipolar Transistors), having a trench gate structure have been known (see Patent Documents 1 and 2, for example).

Patent Document 1: Japanese Patent Application Publication No. 2010-114136
Patent Document 2: Japanese Patent Application Publication No. 2008-205015

It is desired to improve the dynamic breakdown voltage of semiconductor devices.

SUMMARY

A first aspect of the present invention provides a semiconductor device including: a first-conductivity-type drift region provided in a semiconductor substrate; a first-conductivity-type accumulation region provided above the drift region and having a higher doping concentration than the drift region; a second-conductivity-type base region provided above the accumulation region; and an electric-field relaxation layer provided between the accumulation region and the base region and having a lower doping concentration than the accumulation region.

The electric-field relaxation layer may include a first-conductivity-type region including a region having a same doping concentration as the drift region.

In the electric-field relaxation layer, the region having the same doping concentration as the drift region may extend over a length of 0.5 µm or more in a depth direction of the semiconductor substrate.

A doping concentration of the electric-field relaxation layer may be lower by one or more orders of magnitude than a peak in doping concentration of the accumulation region.

A doping concentration of the electric-field relaxation layer may be lower than a peak in doping concentration of the base region.

A thickness of the electric-field relaxation layer may be equal to or smaller than a thickness of the accumulation region.

A thickness of the electric-field relaxation layer may be 0.5 µm or more and less than 1.5 µm.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side of a direction parallel to the depth direction of a semiconductor substrate is referred to as an "upper" side, and the other side is referred to as a "lower" side. One of two principal surfaces of a substrate, layer or another member is referred to as an upper surface, and the other surface is referred to as a lower surface. The "upper" and "lower" directions are not limited by the directions of gravity.

In this specification, technical matters may be described using the orthogonal coordinate axes of X-axis, Y-axis and Z-axis. In this specification, an X-Y plane is defined as a plane parallel to the upper surface of a semiconductor substrate, and a Z-axis direction is defined as the depth direction of the semiconductor substrate.

Although each embodiment example shows that a first conductivity type is N type and a second conductivity type is P type, the first conductivity type may be P type and the second conductivity type may be N type. In that case, the conductivity type of each substrate, layer, region and the like in each embodiment example will be of the opposite polarity.

In this specification, a doping concentration refers to the concentration of impurities serving as donors or acceptors. In this specification, a doping concentration may be the difference in concentration of donors and acceptors. The doping concentration of a doped region may be the value of a peak in doping concentration distribution of the doped region.

In this specification, the character "N" or "P" borne by a layer or region means that electrons or holes are the majority carriers of the layer or region, respectively. The sign "+" or "−" given to the character "N" or "P" means having a higher or lower doping concentration than layers or regions without it, respectively.

Figure 1A:
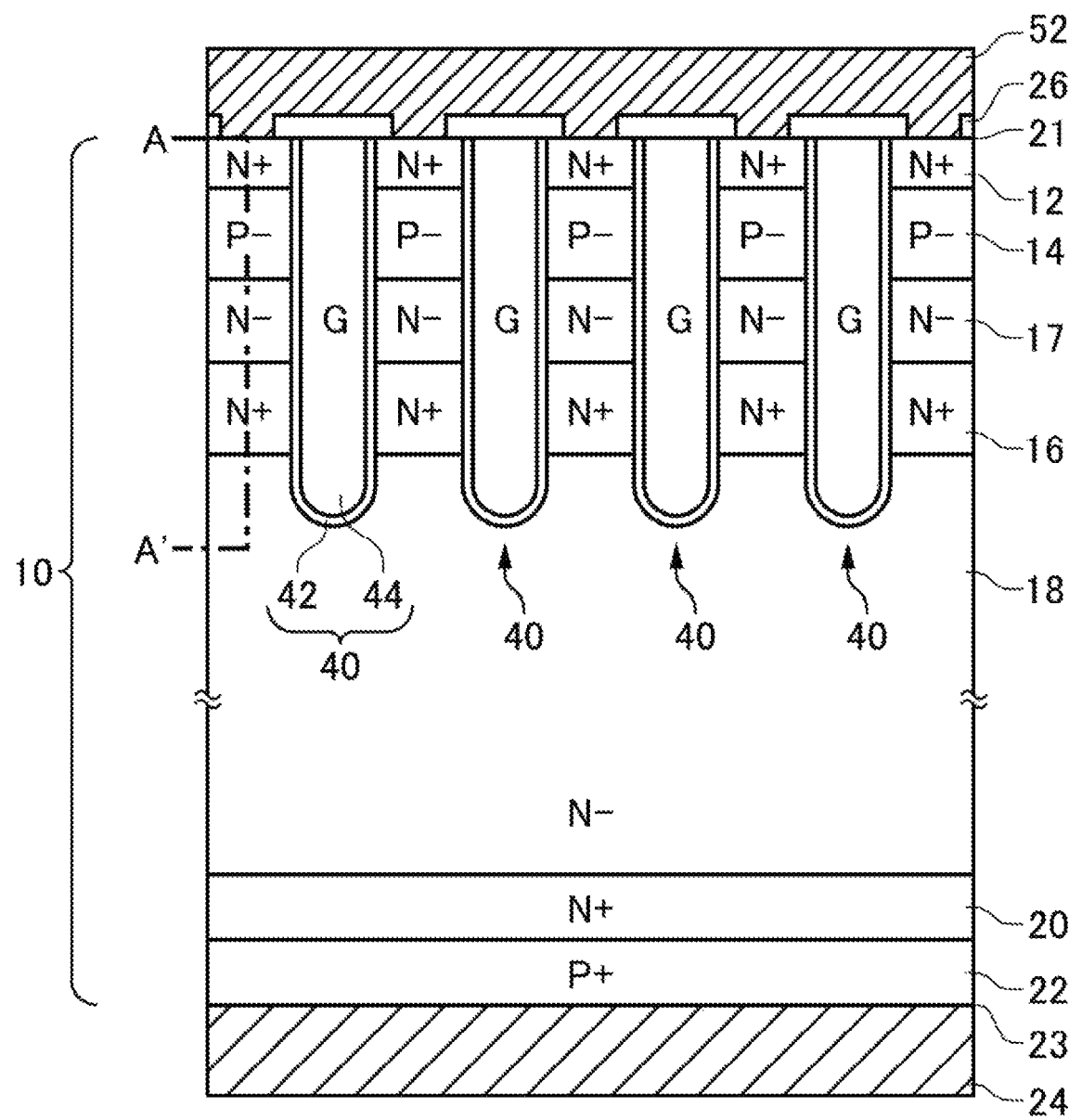
FIG. 1A shows an example of a cross-section of a semiconductor device 100 in accordance with an embodiment example.

FIG. 1A shows an example of a cross-section of a semiconductor device 100 in accordance with an embodiment example. The members shown in FIG. 1A are formed extending in the directions perpendicular to the sheet of the figure. The ON resistance and ON voltage of the semiconductor device 100 are reduced due to conductivity modulation. As an example, the semiconductor device 100 is a semiconductor chip including an IGBT. In this cross-section, the semiconductor device 100 in this example includes a semiconductor substrate 10, an interlayer dielectric film 26, an emitter electrode 52 and a collector electrode 24.

The interlayer dielectric film 26 is provided on the upper surface, 21, of the semiconductor substrate 10. For example, the interlayer dielectric film 26 is a phosphorus-added silicate glass film (PSG film), or a phosphorus and boron-added silicate glass film (BPSG film).

The emitter electrode 52 is provided above the upper surface 21 of the semiconductor substrate 10. The emitter electrode 52 in this example is formed on the upper surface of the interlayer dielectric film 26. The emitter electrode 52 may contact a partial region of the upper surface 21 of the semiconductor substrate 10. The interlayer dielectric film 26 in this example has openings exposing emitter regions 12 formed near the upper surface 21 of the semiconductor substrate 10. The emitter electrode 52 is also formed in the openings and contacts the emitter regions 12. The interlayer dielectric film 26 insulates the emitter electrode 52 and gate conductive portions 44 from each other.

The collector electrode 24 is provided on the lower surface, 23, of the semiconductor substrate 10. The emitter electrode 52 and the collector electrode 24 are formed of electrically-conductive materials such as metals. For example, the emitter electrode 52 and the collector electrode 24 may be formed of electrically-conductive materials containing aluminum. Portions of the emitter electrode 52 and the collector electrode 24 formed in fine regions such as the openings of the insulating film may be formed of electrically-conductive materials containing tungsten.

The semiconductor substrate 10 may be a silicon substrate, a silicon carbide substrate, a nitride semiconductor substrate such as gallium nitride, or the like. The semiconductor substrate 10 in this example is a silicon substrate.

A drift region 18 is a first-conductivity-type region provided in the semiconductor substrate 10. As an example, the drift region 18 in this example is of N− type. The drift region 18 may be a remaining region of the semiconductor substrate 10 in which other doped regions are not formed. That is, the doping concentration of the drift region 18 may be the doping concentration of the semiconductor substrate 10.

An emitter region 12 is a first-conductivity-type region provided near the upper surface 21 of the semiconductor substrate 10. As an example, the emitter region 12 is of N+ type. The emitter region 12 is provided in contact with gate trench portions 40. The emitter region 12 is provided in a mesa portion between adjacent gate trench portions 40 and extends from one of the gate trench portions 40 to the other gate trench portion 40.

A base region 14 is a second-conductivity-type region provided near the upper surface 21 of the semiconductor substrate 10. As an example, the base region 14 is of P− type. The base region 14 is provided below the emitter region 12. Also, the base region 14 is provided above an accumulation region 16.

The accumulation region 16 is a first-conductivity-type region provided above the drift region 18. As an example, the accumulation region 16 in this example is of N+ type. The accumulation region 16 is provided in contact with gate trench portions 40. The doping concentration of the accumulation region 16 is higher than the doping concentration of the drift region 18. When holes are injected from the direction of the lower surface 23 of the semiconductor substrate 10 to the drift region 18, and the accumulation region 16 inhibits the holes from passing toward the upper surface 21 of the semiconductor substrate 10, so as to increase the carrier density near the upper surface of the drift region 18. As such, the accumulation region 16 causes the conductivity modulation of the semiconductor device 100 due to the carrier injection enhancement effect (IE effect). This lowers the conducting resistance of the semiconductor device 100, so that the ON voltage can be reduced.

An electric-field relaxation layer 17 is provided between the base region 14 and the accumulation region 16. The electric-field relaxation layer 17 may be a first-conductivity-type region, or may be a second-conductivity-type region. As an example, the electric-field relaxation layer 17 is of N− type. The doping concentration of the electric-field relaxation layer 17 is lower than the peak in doping concentration of the accumulation region 16. The doping concentration of the electric-field relaxation layer 17 is preferably lower by one or more orders of magnitude than the peak in doping concentration of the accumulation region 16. The doping concentration of the electric-field relaxation layer 17 is lower than the peak in doping concentration of the base region 14. Note that, while the electric-field relaxation layer 17 in this example is a first-conductivity-type region, it may be a second-conductivity-type region. In this specification, the doping concentration of the electric-field relaxation layer 17 refers to the doping concentration of majority carriers.

In an example, the electric-field relaxation layer 17 includes a region having the same doping concentration as the drift region 18. The electric-field relaxation layer 17 may include the region having the same doping concentration as the drift region 18 in the depth direction. To include the region having the same doping concentration as the drift region 18 in the depth direction means that the region having the same doping concentration as the drift region 18 has a thickness in the depth direction. For example, the electric-field relaxation layer 17 includes the region having the same doping concentration as the drift region 18 over a length of 0.5 μm or more in the depth direction of the semiconductor substrate 10.

The electric-field relaxation layer 17 relaxes the electric field near the upper surface 21 of the semiconductor substrate 10. The electric-field relaxation layer 17 deconcentrates the electric field at the interface between the base region 14 and the accumulation region 16, so as to relax the peak of the electric field. This improves the breakdown voltage of the semiconductor device 100. Note that the thickness of the electric-field relaxation layer 17 is preferably equal to or smaller than the thickness of the accumulation region 16. If the thickness of the electric-field relaxation layer 17 is excessively large, the electric field is concentrated near the accumulation region 16, and the electric field between the base region 14 and the accumulation region 16 cannot be sufficiently relaxed. On the other hand, if the thickness of the electric-field relaxation layer 17 is excessively small, the electric field cannot be easily deconcentrated, and the electric field between the base region 14 and the accumulation region 16 cannot be sufficiently relaxed.

A buffer region 20 is a first-conductivity-type region provided below the drift region 18. As an example, the buffer region 20 in this example is of N+ type. The doping concentration of the buffer region 20 is higher than the doping concentration of the drift region 18. The buffer region 20 may serve as a field-stop layer to prevent a depletion layer expanding from the direction of the lower surface of the base region 14 from reaching a second-conductivity-type collector region 22 and a first-conductivity-type cathode region.

Gate trench portions 40 are arrayed at predetermined intervals along a predetermined array direction (the Y-axis direction in this example). The gate trench portions 40 extend along an extending direction (the X-axis direction in this example) parallel to the upper surface 21 of the semiconductor substrate 10 and perpendicular to the array direction. The gate trench portions 40 in this example are electrically connected to a gate metal layer. The gate trench portions 40 extend from the upper surface 21 of the semiconductor substrate 10 to the drift region 18 through the emitter region 12, the base region 14, the electric-field relaxation layer 17 and the accumulation region 16. Each gate trench portion 40 has a gate trench, a gate insulating film 42 and a gate conductive portion 44, formed into the upper surface 21.

The gate insulating film 42 is formed to cover the inner wall of the gate trench. The gate insulating film 42 may be formed by oxidizing or nitriding the semiconductor material of the inner wall of the gate trench. The gate insulating film 42 insulates the gate conductive portion 44 and the semiconductor substrate 10 from each other.

The gate conductive portion 44 is formed inside the gate insulating film 42 in the gate trench. The gate conductive portion 44 is formed of an electrically-conductive material such as polysilicon. The gate trench portion 40 is covered by the interlayer dielectric film 26 at the upper surface 21. The gate conductive portion 44 at least includes a region facing adjacent base regions 14. When a predetermined voltage is applied to the gate conductive portion 44, a channel is formed in the base regions 14 at their interfacial surface layers contacting the gate trench portion 40. The gate conductive portion 44 in this example includes a portion protruding toward the lower surface 23 of the semiconductor substrate 10 beyond the lower surface of the accumulation region 16.

In the cross-section shown in FIG. 1A, an emitter region 12, a base region 14, an electric-field relaxation layer 17 and an accumulation region 16 are provided in a region of the semiconductor substrate 10 sandwiched by two gate trench portions 40. In a region of the upper surface 21 of the semiconductor substrate 10 sandwiched by two gate trench portions 40, N+ type emitter regions 12 and P+ type contact regions may be provided. The emitter regions 12 and the contact regions may be alternately arranged in the X-axis direction. Each of the emitter regions 12 and the contact regions may be provided in contact with the two adjacent gate trench portions 40.

Figure 1B:
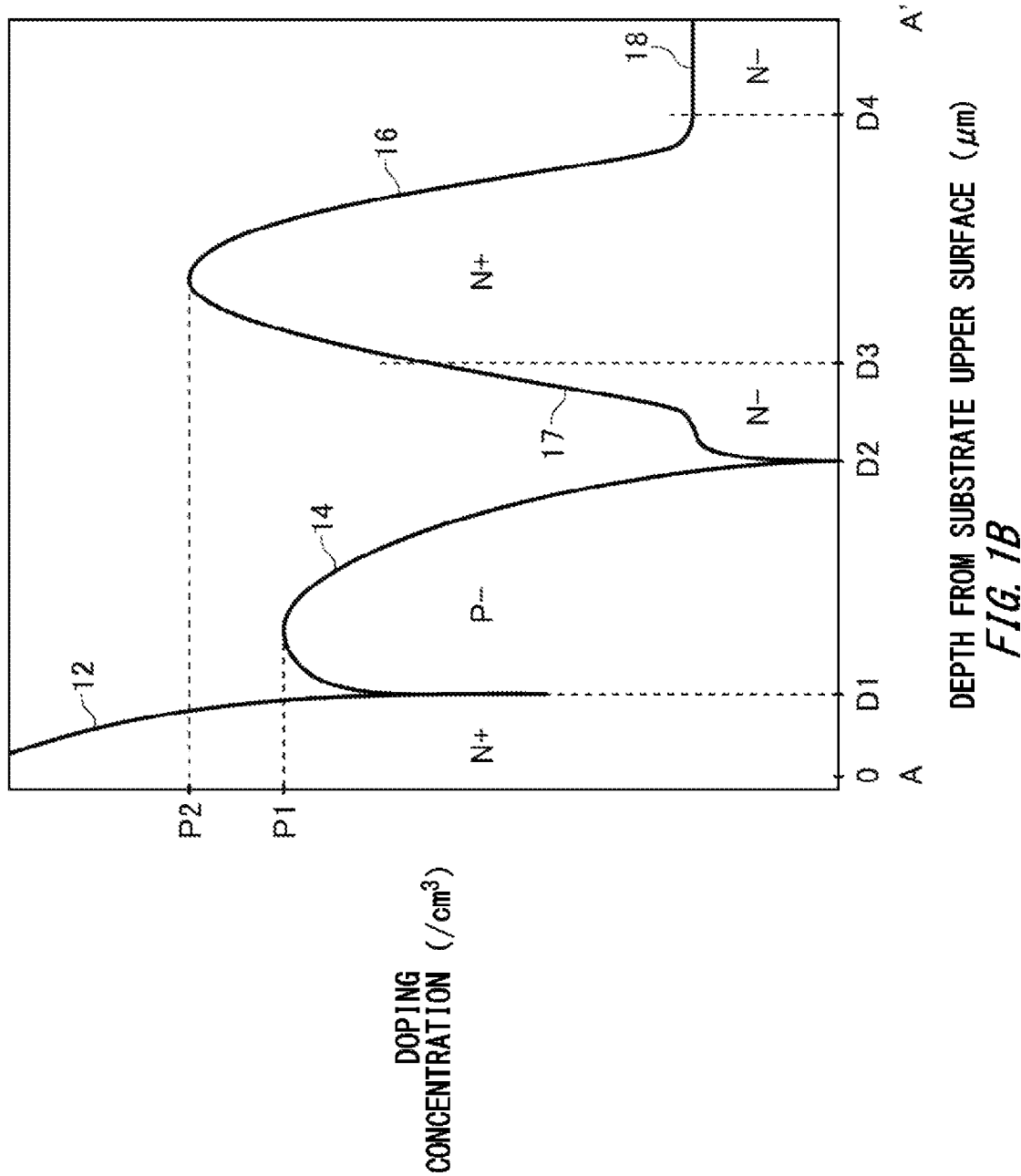
FIG. 1B shows an example of the doping concentration distribution of the semiconductor device 100 in its depth direction in accordance with the embodiment example.

FIG. 1B shows an example of the doping concentration distribution of the semiconductor device 100 in its depth direction in accordance with the embodiment example. The vertical axis indicates doping concentration (cm$^{-3}$) on a logarithmic scale, and the horizontal axis indicates depth (μm) from the upper surface 21 of the semiconductor substrate 10.

The doping concentration distribution in this example is the doping concentration distribution in the cross-section taken along A-A' in FIG. 1A. That is, this example shows the doping concentration distribution in the emitter region 12, the base region 14, the electric-field relaxation layer 17, the accumulation region 16 and the drift region 18 corresponding to the cross-section taken along A-A' in FIG. 1A. Depths D1 to D4 indicate depths from the upper surface 21 of the semiconductor substrate 10.

The emitter region 12 in this example shows the maximum doping concentration near the upper surface 21 of the semiconductor substrate 10 (that is, near the depth 0 μm). In an example, the maximum value of the doping concentration of the emitter region 12 is $1.0 \times 10^{20}$ cm$^{-3}$ or more.

Depth D1 indicates the depth of the lower end of the emitter region 12 relative to the upper surface 21 of the semiconductor substrate 10. That is, depth D1 corresponds to the boundary position between the emitter region 12 and the base region 14. Depth D1 is the depth of the junction of doping concentration distribution between the N type emitter region 12 and the P type base region 14.

For example, depth D1 is set within a range of 0.3 μm or more and 0.8 μm or less from the upper surface 21 of the semiconductor substrate 10. In the present embodiment example, the maximum value of the doping concentration of the base region 14 is $5.0 \times 10^{16}$ cm$^{-3}$ or more and $5.0 \times 10^{17}$ cm$^{-3}$ or less. In the present embodiment example, the position of peak P1 in doping concentration of the base region 14 is provided within a range of 0.8 μm or more and 1.8 μm or less from the upper surface 21 of the semiconductor substrate 10.

Depth D2 indicates the depth of the lower end of the base region 14 relative to the upper surface 21 of the semiconductor substrate 10. Depth D2 corresponds to the boundary position between the base region 14 and the electric-field relaxation layer 17. Depth D2 is the depth of the junction of doping concentration distribution between the P type base region 14 and the N type electric-field relaxation layer 17.

For example, depth D2 is set within a range of 1.5 μm or more and 2.5 μm or less from the upper surface 21 of the semiconductor substrate 10. In the present embodiment example, the maximum value of the doping concentration of the accumulation region 16 is $5.0 \times 10^{17}$ cm$^{-3}$ or more and $5.0 \times 10^{18}$ cm$^{-3}$ or less. In the present embodiment example, the depth position at which the doping concentration of the accumulation region 16 is the maximum is arranged within a range of 3.0 μm or more and 4.0 μm or less from the upper surface 21 of the semiconductor substrate 10.

Depth D3 indicates the depth of the lower end of the electric-field relaxation layer 17 relative to the upper surface 21 of the semiconductor substrate 10. Depth D3 corresponds to the boundary position between the electric-field relaxation layer 17 and the accumulation region 16. In an example, depth D3 is determined as a depth at which the doping concentration has a predetermined ratio to peak P2 in doping concentration of the accumulation region 16. Depth D3 in this example is determined such that the boundary position between the accumulation region 16 and the electric-field relaxation layer 17 is a position corresponding to the half of peak P2 of the accumulation region 16 in the doping concentration distribution.

The doping concentration of the electric-field relaxation layer 17 is lower than peak P1 in doping concentration of the base region 14. The doping concentration of the electric-field relaxation layer 17 is lower than peak P2 in doping concentration of the accumulation region 16. The electric-field relaxation layer 17 may include a region having the same doping concentration as the drift region 18. In this case, the electric-field relaxation layer 17 can be formed as a remaining region of the drift region 18, and therefore it is unnecessary to perform additional ion-implantation for the electric-field relaxation layer 17. Thus, the manufacturing cost of the semiconductor device 100 is reduced.

Depth D4 indicates the depth of the lower end of the accumulation region 16 relative to the upper surface 21 of the semiconductor substrate 10. Depth D4 is a depth corresponding to the same concentration as the drift region 18. For example, depth D4 is arranged within a range of 3.5 µm or more and 4.5 µm or less from the upper surface 21 of the semiconductor substrate 10. In the present embodiment example, the drift region 18 has an approximately constant doping concentration. In the present embodiment example, the doping concentration of the drift region 18 is $5.0 \times 10^{13}$ cm$^{-3}$ or more and $5.0 \times 10^{14}$ cm$^{-3}$ or less.

Note that, in this example, peak P2 in doping concentration of the accumulation region 16 is greater than peak P1 in doping concentration of the base region 14. This can improve the carrier accumulation effect of the accumulation region 16, to reduce the ON resistance.

Figure 2A:
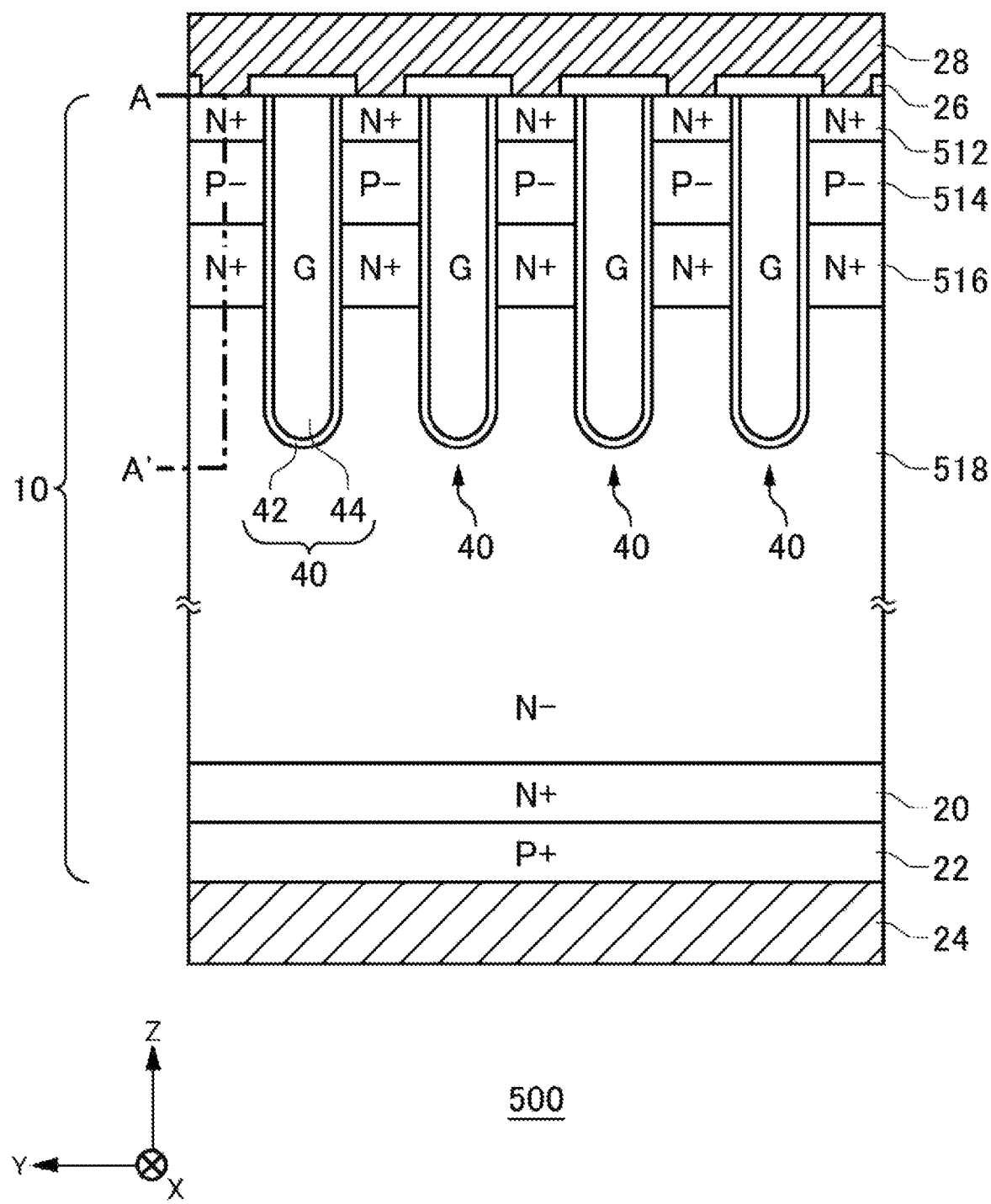
FIG. 2A shows an example of a cross-section of a semiconductor device 500 in accordance with a comparative example.

FIG. 2A shows an example of a cross-section of a semiconductor device 500 in accordance with a comparative example. The semiconductor device 500 in this example is different than the semiconductor device 100 in accordance with the embodiment example, in that it does not include the electric-field relaxation layer 17. The semiconductor device 500 includes an emitter region 512, a base region 514, an accumulation region 516 and a drift region 518 in a mesa portion between adjacent gate trench portions 40. In the semiconductor device 500, the base region 514 and the accumulation region 516 are provided in direct contact with each other. Since the semiconductor device 500 does not include the electric-field relaxation layer 17, the electric field is concentrated between the base region 514 and the accumulation region 516.

In the semiconductor device 500, which has a trench gate structure, the density of holes injected from the collector due to the conductivity modulation decreases towards the emitter. As a result, the carrier density is lowered near the emitter, so that the ON resistance cannot be sufficiently reduced. In the semiconductor device 500, the accumulation region 516, having a high doping concentration, is provided below the base region 514, and thus the carrier density near the emitter can be improved. However, increasing the concentration of the accumulation region 516 decreases the dynamic breakdown voltage of the accumulation region 516. In this case, when a high voltage is applied to the semiconductor device 500, the electric field is concentrated at the interface between the base region 514 and the accumulation region 516. When avalanche current is generated due to the electric field concentration, the collector current is not saturated, so that the gate controllability may be worsened.

Note that the dynamic breakdown voltage corresponds to the collector-emitter voltage Vce when a current equal to or larger than a predetermined magnitude of current flows between the collector and emitter at the time of gate turn-on. When an avalanche occurs at the time of gate turn-on, the avalanche current is superimposed on the collector current Jc, so that the collector current Jc is not saturated.

Figure 2B:
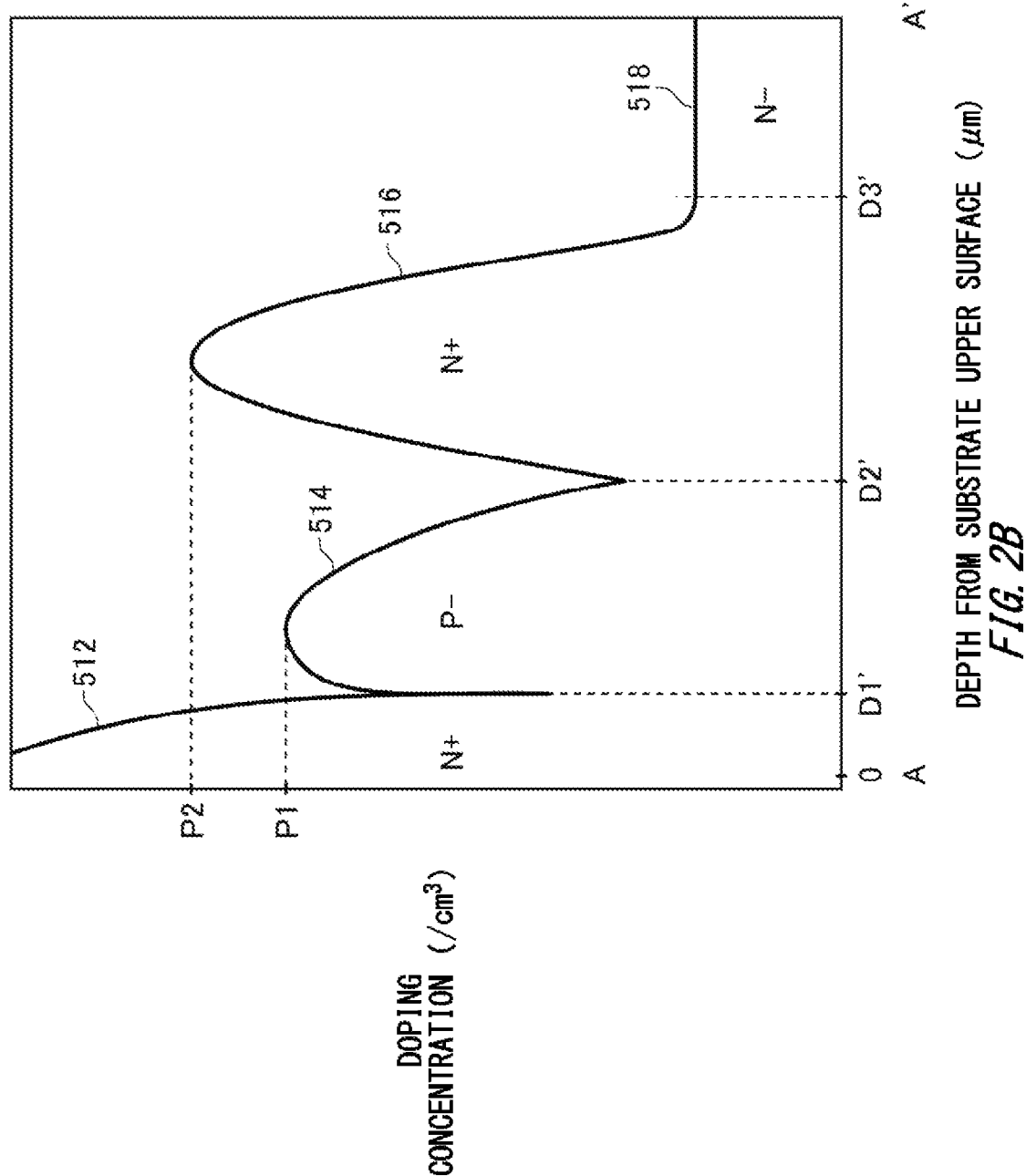
FIG. 2B shows an example of the doping concentration distribution of the semiconductor device 500 in its depth direction in accordance with the comparative example.

FIG. 2B shows an example of the doping concentration distribution of the semiconductor device 500 in its depth direction in accordance with the comparative example. The doping concentration distribution in this example is the doping concentration distribution in the cross-section taken along A-A' in FIG. 2A.

Depth D1' indicates the depth of the lower end of the emitter region 512 relative to the upper surface 21 of the semiconductor substrate 10. Depth D1' corresponds to the boundary position between the emitter region 512 and the base region 514. Depth D1' is the depth of the junction of doping concentration distribution between the N type emitter region 512 and the P type base region 514.

Depth D2' indicates the depth of the lower end of the base region 514 relative to the upper surface 21 of the semiconductor substrate 10. Depth D2' corresponds to the boundary position between the base region 514 and the accumulation region 516. Depth D2' is the depth of the junction of doping concentration distribution between the P type base region 514 and the N type accumulation region 516.

Depth D3' indicates the depth of the lower end of the accumulation region 516 relative to the upper surface 21 of the semiconductor substrate 10. Depth D3' is a depth corresponding to the same concentration as the drift region 518. Note that, in the semiconductor device 500, peak P2 in doping concentration of the accumulation region 516 is higher than peak P1 in doping concentration of the base region 514.

As such, in addition to being an interface of P type and N type, the interface between the base region 514 and the accumulation region 516 at which they directly contact has an increased carrier density due to the accumulation region 516. Thus, the electric field is easily concentrated at the interface between the base region 514 and the accumulation region 516.

Figure 3:
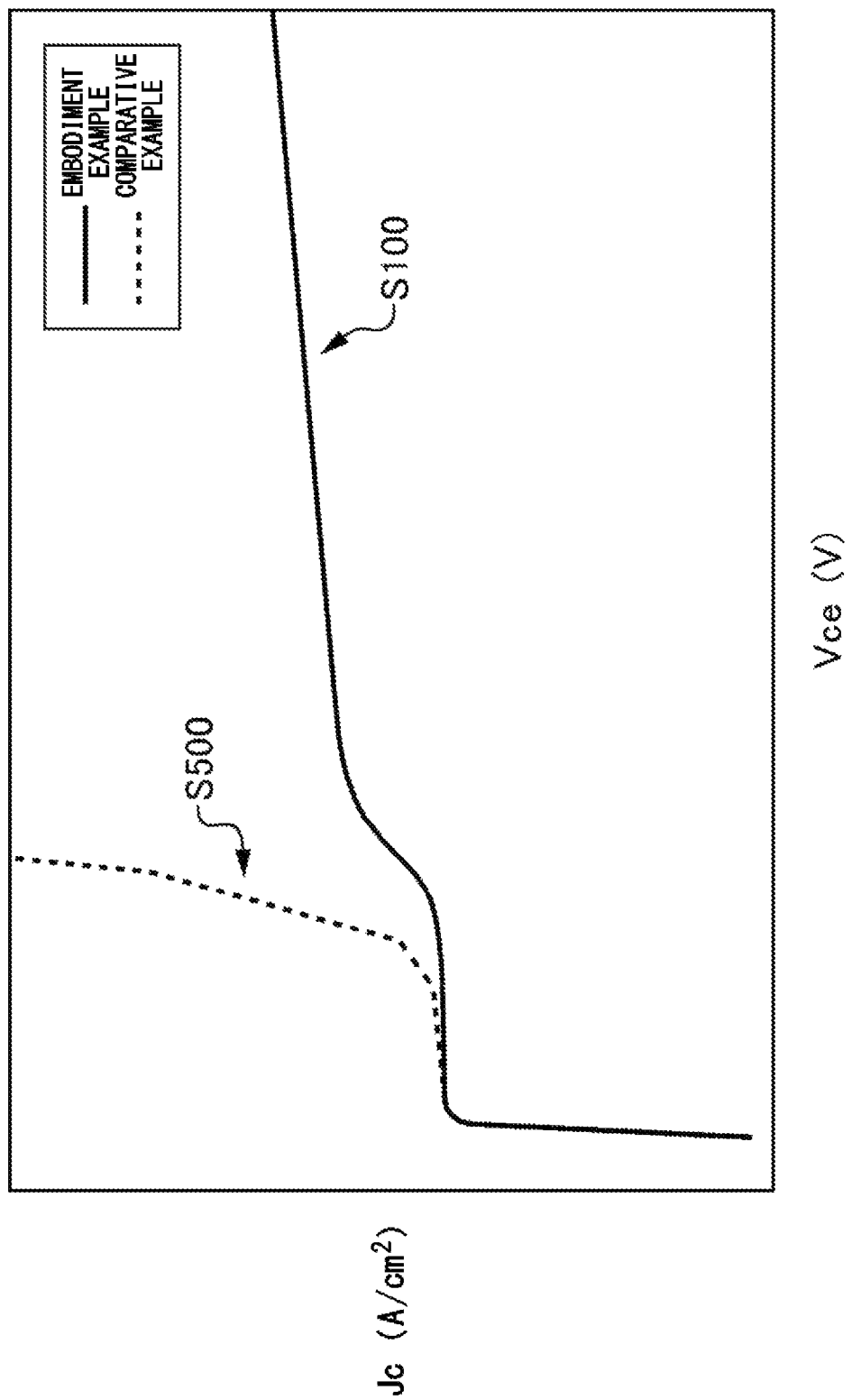
FIG. 3 shows the saturation characteristics of collector current Jc depending on the presence or absence of an electric-field relaxation layer 17.

FIG. 3 shows the saturation characteristics of collector current Jc depending on the presence or absence of an electric-field relaxation layer 17. The vertical axis indicates collector current Jc (A/cm$^2$), and the horizontal axis indicates collector-emitter voltage Vce (V). This figure shows a phenomenon of decrease in the FBSOA (Forward Bias Safe Operating Area) withstand capability of the semiconductor device. FIG. 3 shows Vce-Jc characteristics during an ON operation.

Solid line S100 indicates the saturation characteristics of the collector current Jc of the semiconductor device 100. Since the semiconductor device 100 includes the electric-field relaxation layer 17, the electric fields at the interface between the base region 14 and the accumulation region 16 can be relaxed. This can inhibit the generation of avalanche current even when a high collector-emitter voltage Vce is applied. Therefore, even when a high collector-emitter voltage Vce is applied to the semiconductor device 100, the generation of avalanche current is inhibited, so that the collector current Jc is saturated.

In addition, since the semiconductor device 100 includes the electric-field relaxation layer 17, the generation of an avalanche can be inhibited even when the total dose amount of the accumulation region 16 is increased. Thus, in the semiconductor device 100 in this example, decrease in the FBSOA withstand capability can be inhibited while reducing the ON voltage.

Dashed line S500 indicates the saturation characteristics of the collector current Jc of the semiconductor device 500. The semiconductor device 500 does not include the electric-field relaxation layer 17, and when a high voltage is applied, the collector current Jc is not saturated due to avalanche current.

Moreover, in the semiconductor device 500, avalanche current is easily generated at the interface between the base region 514 and the accumulation region 516 when the total dose amount of the accumulation region 16 is increased. As a result, the collector current Jc increases at a low value of Vce, so that the dynamic breakdown voltage is decreased. That is, the FBSOA withstand capability is decreased.

Figure 4:
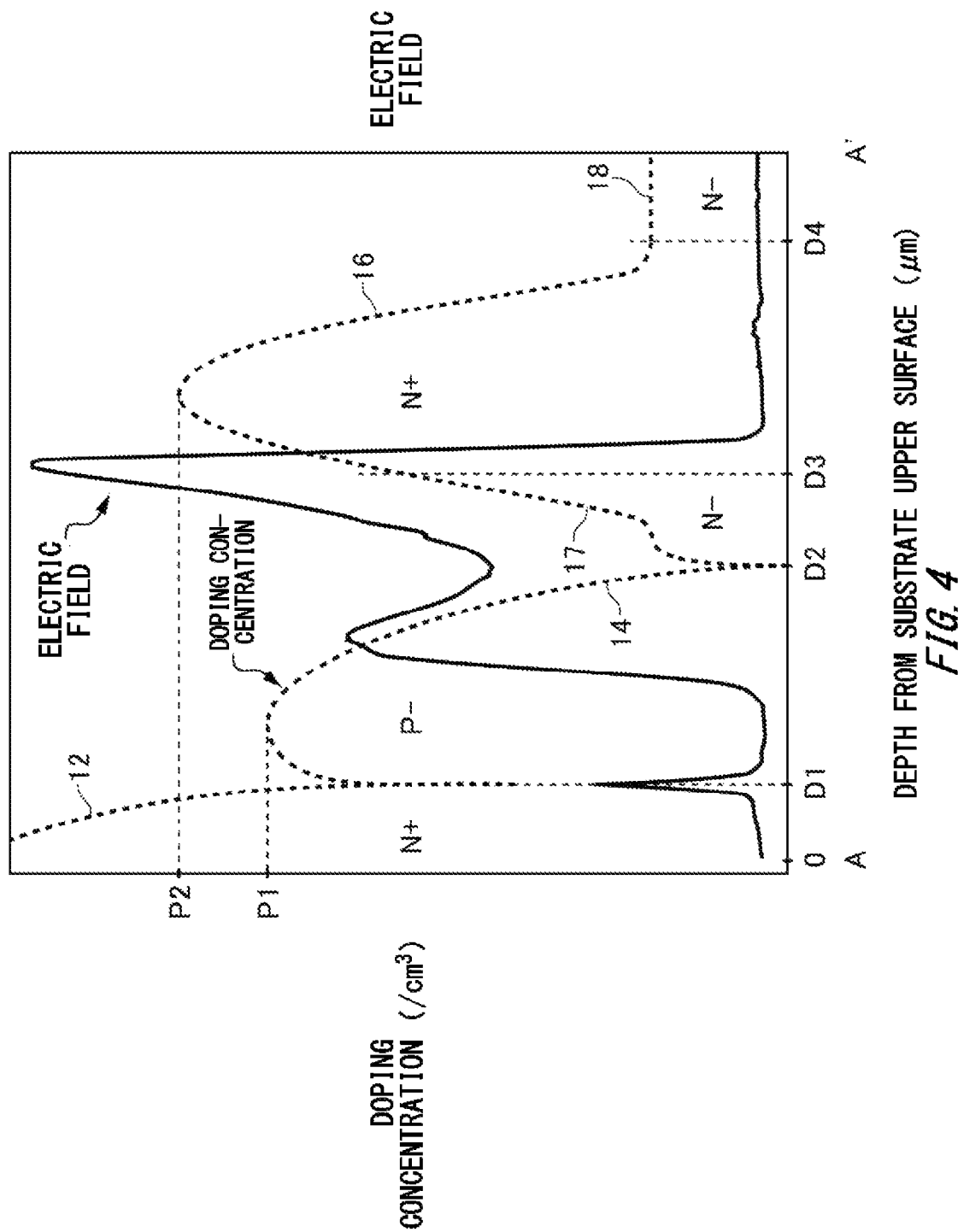
FIG. 4 shows an example of the electric-field strength distribution of the semiconductor device 100.

FIG. 4 shows an example of the electric-field strength distribution of the semiconductor device 100. The vertical axis indicates doping concentration ($cm^{-3}$) and electric field, and the horizontal axis indicates depth (μm) from the upper surface 21 of the semiconductor substrate 10.

In the semiconductor device 100 in this example, the electric-field relaxation layer 17 can relax the electric field in the accumulation region 16 near the upper surface 21. Specifically, the electric field generated at the interface between the electric-field relaxation layer 17 and the accumulation region 16 is deconcentrated to two interfaces: the interface between the base region 14 and the electric-field relaxation layer 17 and the interface between the electric-field relaxation layer 17 and the accumulation region 16, so that the peak of the electric field generated at the interface between the electric-field relaxation layer 17 and the accumulation region 16 is relaxed. Therefore, by providing the electric-field relaxation layer 17, the peak of the electric field in the semiconductor device 100 is relaxed. This inhibits avalanche current and improves the breakdown voltage of the semiconductor device 100.

Figure 5:
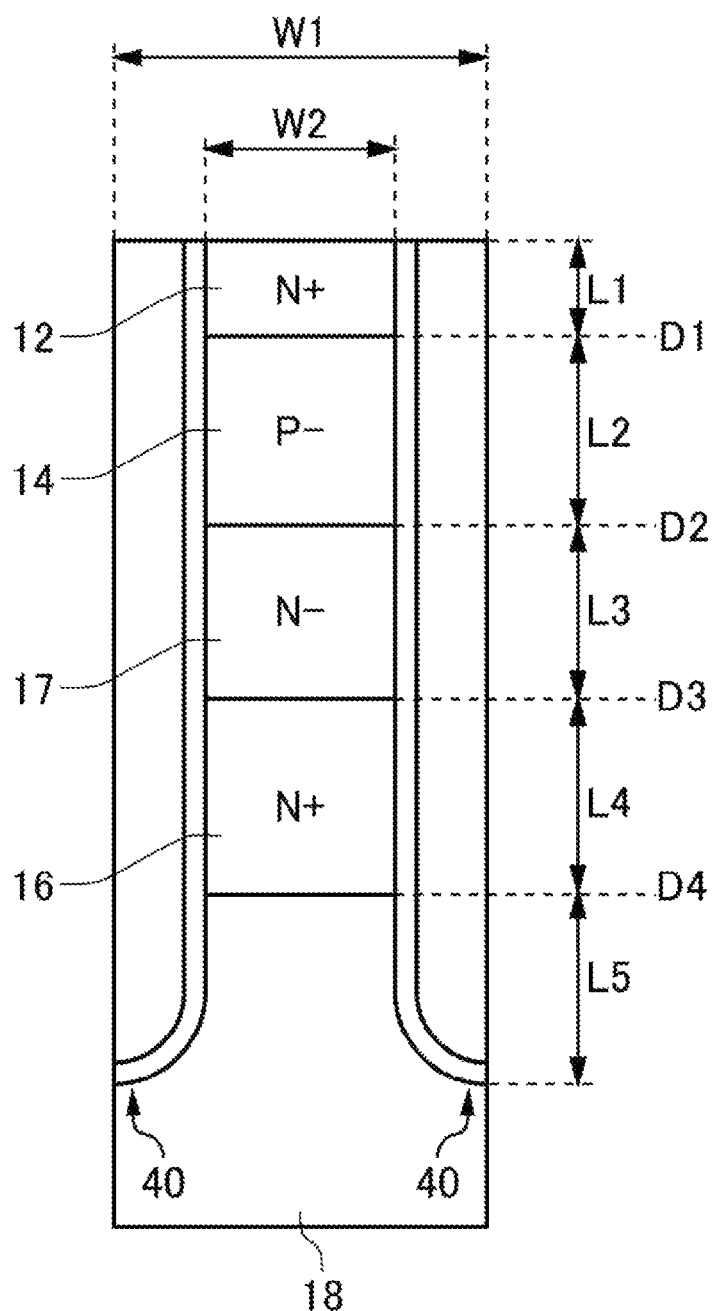
FIG. 5 shows an example of an enlarged view of a cross-section of the semiconductor device 100.

FIG. 5 shows an example of an enlarged view of a cross-section of the semiconductor device 100. This figure is an enlarged view of a mesa portion sandwiched by adjacent gate trench portions 40.

Width W1 indicates the interval between the central portions of the two gate trench portions 40. Width W2 indicates the width of the mesa region sandwiched between the two gate trench portions 40.

Length L1 is the thickness of the emitter region 12. That is, length L1 corresponds to the thickness from the upper surface 21 of the semiconductor substrate 10 to depth D1. For example, length L1 is 0.3 μm or more and 0.8 μm or less.

Length L2 is the thickness of the base region 14. Length L2 corresponds to the thickness from depth D1 to depth D2.

Length L3 is the thickness of the electric-field relaxation layer 17. Length L3 corresponds to the thickness from depth D2 to depth D3. For example, length L3 is 0.5 μm or more and less than 1.5 μm.

Length L4 is the thickness of the accumulation region 16. Length L4 corresponds to the thickness from depth D3 to depth D4.

Length L5 is the distance from D4 of the lower end of the accumulation region 16 to the lower end of the gate trench portions 40 protruding downward beyond the lower surface of the accumulation region 16. The accumulation region 16 preferably has a film thickness that does not extend beyond the lower end of the gate trench portion 40.

In a semiconductor device having trench portions, the density of holes injected from the collector due to the conductivity modulation decreases towards the emitter. As a result, the carrier density is lowered near the emitter, so that the ON resistance cannot be sufficiently reduced. In the semiconductor device 100 in this example, the accumulation region 16 is provided below the base region 14, and thus the carrier density near the emitter can be improved. This allows the accumulation region 16 to have a higher concentration than the base region 14.

As such, increasing the maximum value of the doping concentration of the accumulation region 16 can reduce the ON resistance and ON voltage of the semiconductor device 100. On the other hand, if the total dose amount of the accumulation region 16 is excessively increased, the electric field between the base region 14 and the accumulation region 16 is increased, and thus the dynamic breakdown voltage of the semiconductor device is decreased. Due to the decreased dynamic breakdown voltage of the semiconductor device, when a high voltage is applied, the electric field concentrated between the base region 14 and the accumulation region 16 to generate avalanche current, so that the collector current Jc is not saturated and cannot be controlled with gate voltage, in some cases. For this reason, length L3, which is the thickness of the electric-field relaxation layer 17, is preferably set within a range such that the electric field between the base region 14 and the accumulation region 16 can be sufficiently relaxed.

In an example, length L3, which is the thickness of the electric-field relaxation layer 17, is preferably smaller than length L4, which is the thickness of the accumulation region 16. Length L3 of the electric-field relaxation layer 17 is equal to or smaller than the sum, L1+L2, of the lengths of the emitter region 12 and the base region 14. Length L3 of the electric-field relaxation layer 17 may be equal to or smaller than length L2 of the base region 14. Length L3 of the electric-field relaxation layer 17 may be equal to or smaller than length L5 of the protruding portion of the gate trench portion 40, or may be equal to or smaller than half of L5.

Length L3 of the electric-field relaxation layer 17 may be smaller than the interval, W1, between the horizontally-central portions of two horizontally-arrayed gate trench portions 40. Length L3 of the electric-field relaxation layer 17 may be smaller than the width (W1−W2) of a gate trench portion 40. Mesa width W2 may be smaller than the width (W1−W2) of the gate trench portion 40. Length L3 of the electric-field relaxation layer 17 may be smaller than mesa width W2.

Figure 6A:
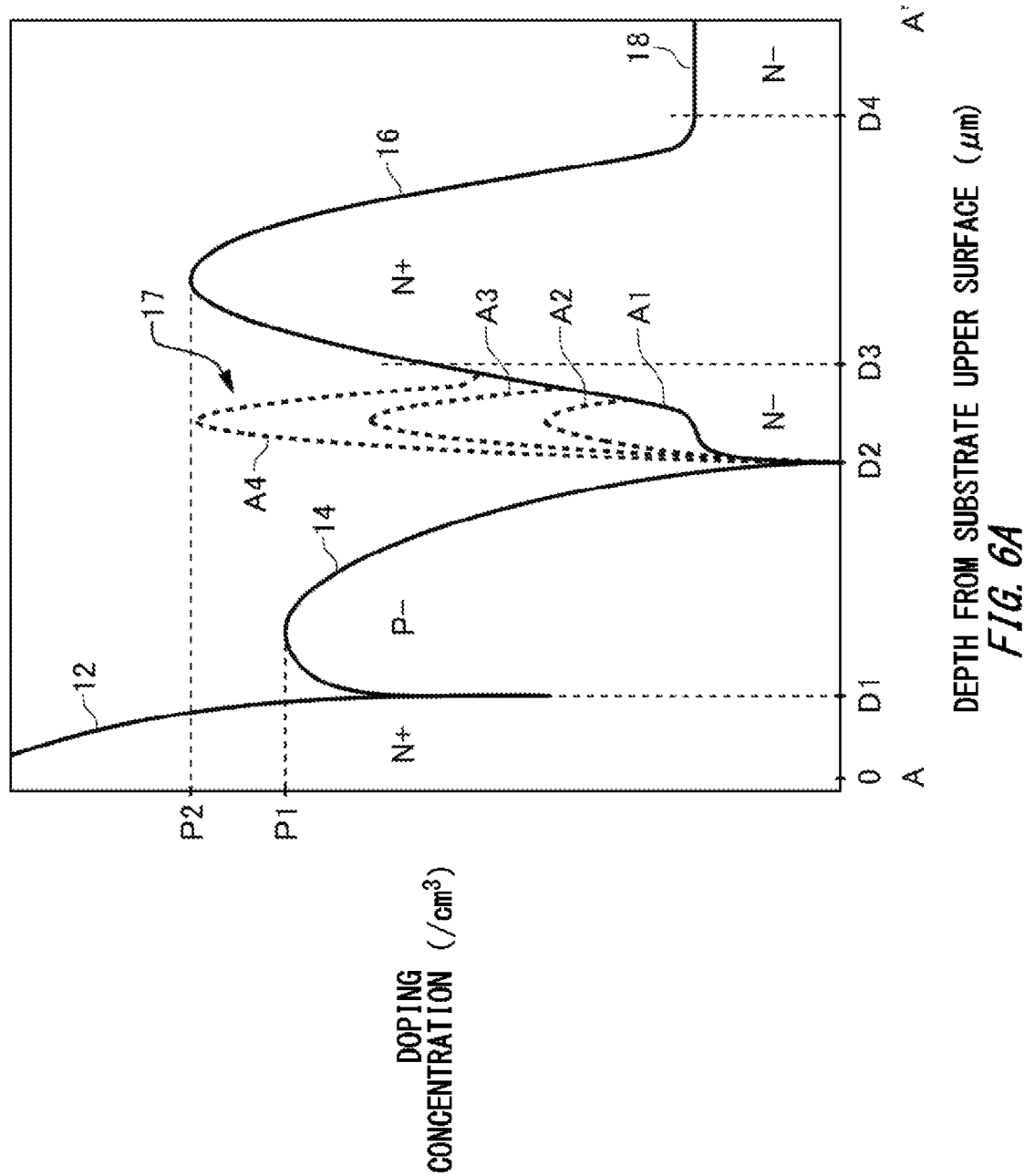
FIG. 6A shows an example of the doping concentration of the electric-field relaxation layer 17.

FIG. 6A shows an example of the doping concentration of the electric-field relaxation layer 17. The doping concentration distribution of the electric-field relaxation layer 17 in this example is varied between four different doping concentration distributions A1 to A4 by varying conditions. Doping concentration distributions A1 to A4 indicates doping concentration distributions obtained by setting the doping concentration of the electric-field relaxation layer 17 to be higher in this order.

Doping concentration distribution A1 indicates the electric-field relaxation layer 17 having a doping concentration lower than the peak in doping concentration of the accumulation region 16. In an example, the electric-field relaxation layer 17 having doping concentration distribution A1 has a peak of $5 \times 10^{14}$ $cm^{-3}$.

Doping concentration distribution A2 indicates the electric-field relaxation layer 17 having a higher doping concentration than the drift region 18. In an example, the electric-field relaxation layer 17 having doping concentration distribution A2 has a peak of $5 \times 10^{15}$ $cm^{-3}$.

Doping concentration distribution A3 indicates the electric-field relaxation layer 17 having a higher doping concentration than the case of doping concentration distribution A2. The electric-field relaxation layer 17 having doping concentration distribution A3 has a doping concentration that is lower by one or more orders of magnitude than that of the accumulation region 16. In an example, the electric-field relaxation layer 17 having doping concentration distribution A3 has a peak of $1 \times 10^{17}$ $cm^{-3}$.

Doping concentration distribution A4 indicates the electric-field relaxation layer 17 having a higher doping concentration than the case of doping concentration distribution A3. The electric-field relaxation layer 17 having doping concentration distribution A4 has a doping concentration that is approximately the same as that of the accumulation region 16. In an example, the electric-field relaxation layer 17 having doping concentration distribution A4 has a peak of $2\times10^{18}$ cm$^{-3}$.

Figure 6B:
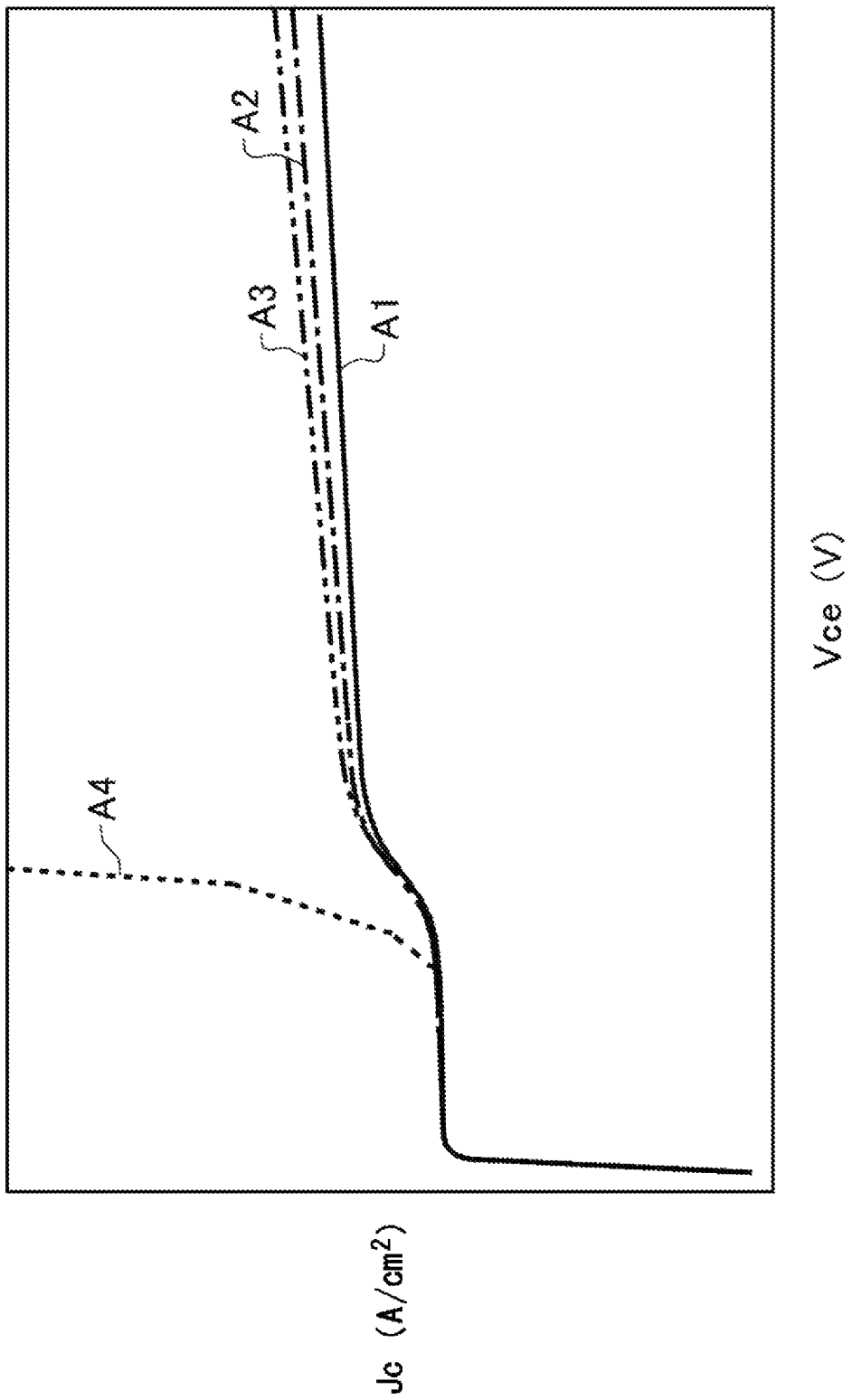
FIG. 6B shows the dependency of the saturation characteristics of the collector current Jc on the doping concentration of the electric-field relaxation layer 17.

FIG. 6B shows the dependency of the saturation characteristics of the collector current Jc on the doping concentration of the electric-field relaxation layer 17. Doping concentration distributions A1 to A4 correspond to the cases of varying the doping concentration of the electric-field relaxation layer 17 as shown in FIG. 6A. The graph lines of the collector current Jc in FIG. 6B correspond to the respective cases of varying the doping concentration of the electric-field relaxation layer 17. If the electric-field relaxation layer 17 has doping concentration distribution A1 to A3, the generation of avalanche current is inhibited and the collector current Jc is saturated even when a high voltage is applied.

On the other hand, if the electric-field relaxation layer 17 has doping concentration distribution A4, the collector current Jc is not saturated due to avalanche current when a high voltage is applied. As such, in the semiconductor device 100, the collector current Jc is not saturated when the difference in concentration between the electric-field relaxation layer 17 and the accumulation region 16 is smaller than one order of magnitude. That is, if the electric-field relaxation layer 17 and the accumulation region 16 both have a high doping concentration, a high electric field is generated at the interface between the electric-field relaxation layer 17 and the accumulation region 16, and thus avalanche current cannot be inhibited. Note that the doping concentration of the accumulation region 16 is preferably high as long as the breakdown voltage is maintained. This allows a low ON voltage to be obtained in the rated current region.

Figure 7A:
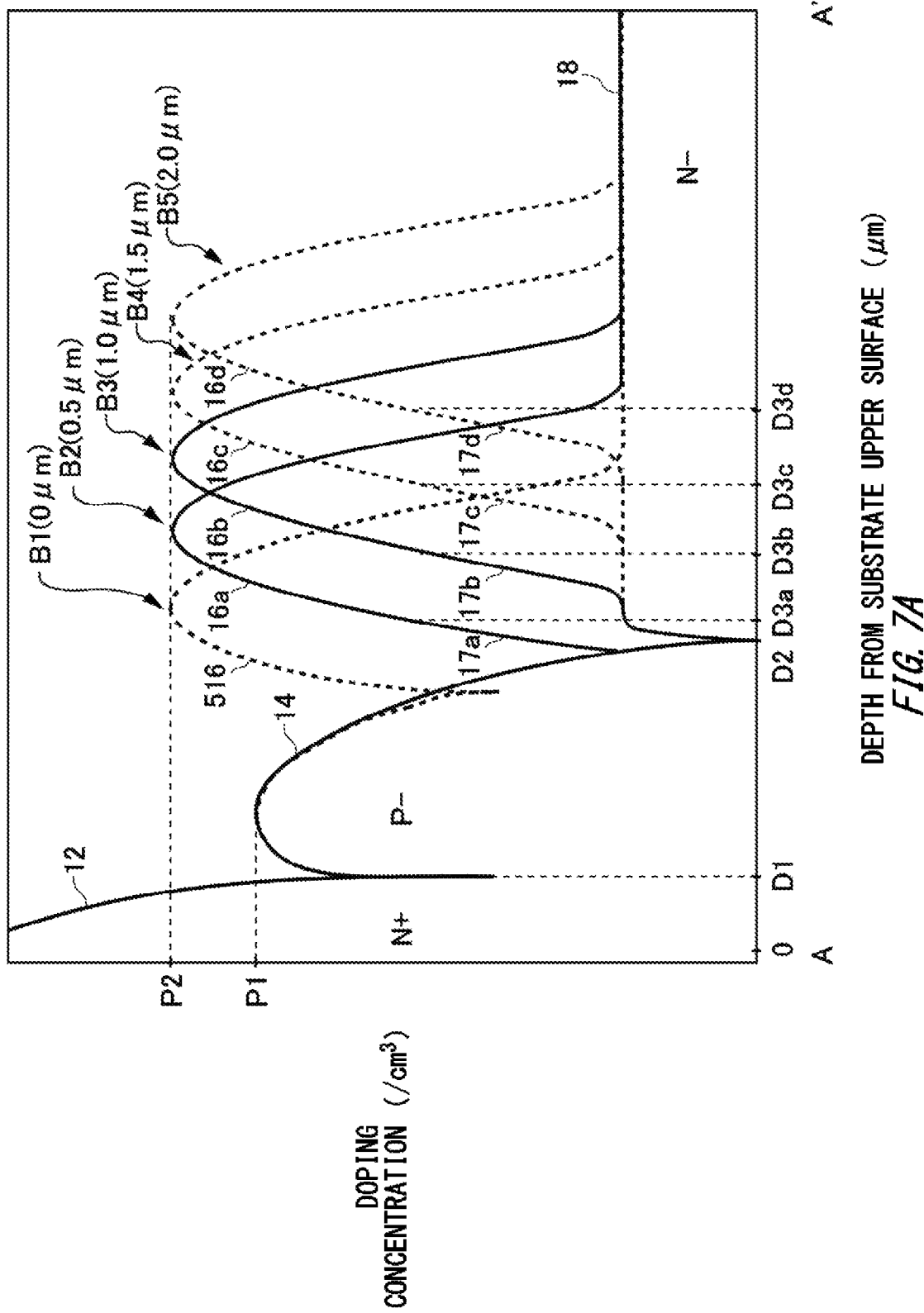
FIG. 7A shows doping concentration distributions obtained by varying the thickness of the electric-field relaxation layer 17.

FIG. 7A shows doping concentration distributions obtained by varying the thickness of the electric-field relaxation layer 17. Doping concentration distributions B1 to B5 indicate doping concentration distributions corresponding to the respective cases of varying the thickness of the electric-field relaxation layer 17. In this specification, the thickness of the electric-field relaxation layer refers to the depth from the junction with the base region 14 to the half value of the peak of the accumulation region 16. Note that the film thickness of the accumulation region is fixed. The film thickness of the accumulation region in this example is 2.0 μm.

Doping concentration distribution B1 indicates the doping concentration distribution of a semiconductor device without the electric-field relaxation layer 17. In this example, the base region 14 is in contact with the accumulation region 516. The accumulation region 516 has peak P2, which is higher than peak P1 of the base region 14.

Doping concentration distribution B2 indicates the doping concentration distribution of the semiconductor device 100 including an electric-field relaxation layer 17a having a predetermined film thickness. The electric-field relaxation layer 17a is in contact with an accumulation region 16a. The accumulation region 16a has peak P2, which is higher than peak P1 of the base region 14. Doping concentration distribution B2 indicates the same doping concentration distribution as in the case of FIG. 1B. The film thickness of the electric-field relaxation layer 17a in this example is smaller than the film thickness of the accumulation region 16a. The film thickness of the electric-field relaxation layer 17a in this example is 0.5 μm. The electric-field relaxation layer 17a having doping concentration distribution B2 includes a region having the same doping concentration as the doping concentration of the drift region 18. Note that D3a indicates the boundary between the electric-field relaxation layer 17a and the accumulation region 16a.

Doping concentration distribution B3 indicates the doping concentration distribution of the semiconductor device 100 including an electric-field relaxation layer 17b that is thicker than the electric-field relaxation layer 17a having doping concentration distribution B2. The electric-field relaxation layer 17b is in contact with an accumulation region 16b. The accumulation region 16b has peak P2, which is higher than peak P1 of the base region 14. The film thickness of the electric-field relaxation layer 17b in this example is smaller than the film thickness of the accumulation region 16b. The film thickness of the electric-field relaxation layer 17b in this example is 1.0 μm. The electric-field relaxation layer 17b having doping concentration distribution B3 includes a region having the same doping concentration as the doping concentration of the drift region 18. Note that D3b indicates the boundary between the electric-field relaxation layer 17b and the accumulation region 16b.

Doping concentration distribution B4 indicates the doping concentration distribution of the semiconductor device 100 including an electric-field relaxation layer 17c that is thicker than the electric-field relaxation layer 17b having doping concentration distribution B3. The electric-field relaxation layer 17c is in contact with an accumulation region 16c. The accumulation region 16c has peak P2, which is higher than peak P1 of the base region 14. The film thickness of the electric-field relaxation layer 17c in this example is smaller than the film thickness of the accumulation region 16c. The film thickness of the electric-field relaxation layer 17c in this example is 1.5 μm. The electric-field relaxation layer 17c having doping concentration distribution B3 includes a region having the same doping concentration as the doping concentration of the drift region 18. Note that D3c indicates the boundary between the electric-field relaxation layer 17c and the accumulation region 16c.

Doping concentration distribution B5 indicates the doping concentration distribution of a semiconductor device including an electric-field relaxation layer 17d that is thicker than the electric-field relaxation layer 17c having doping concentration distribution B4. The electric-field relaxation layer 17d is in contact with an accumulation region 16d. The accumulation region 16d has peak P2, which is higher than peak P1 of the base region 14. The film thickness of the electric-field relaxation layer 17d in this example is larger than the film thickness of the accumulation region 16d. Note that D3d indicates the boundary between the electric-field relaxation layer 17d and the accumulation region 16d. The film thickness of the electric-field relaxation layer 17d in this example is 2.0 μm.

Figure 7B:
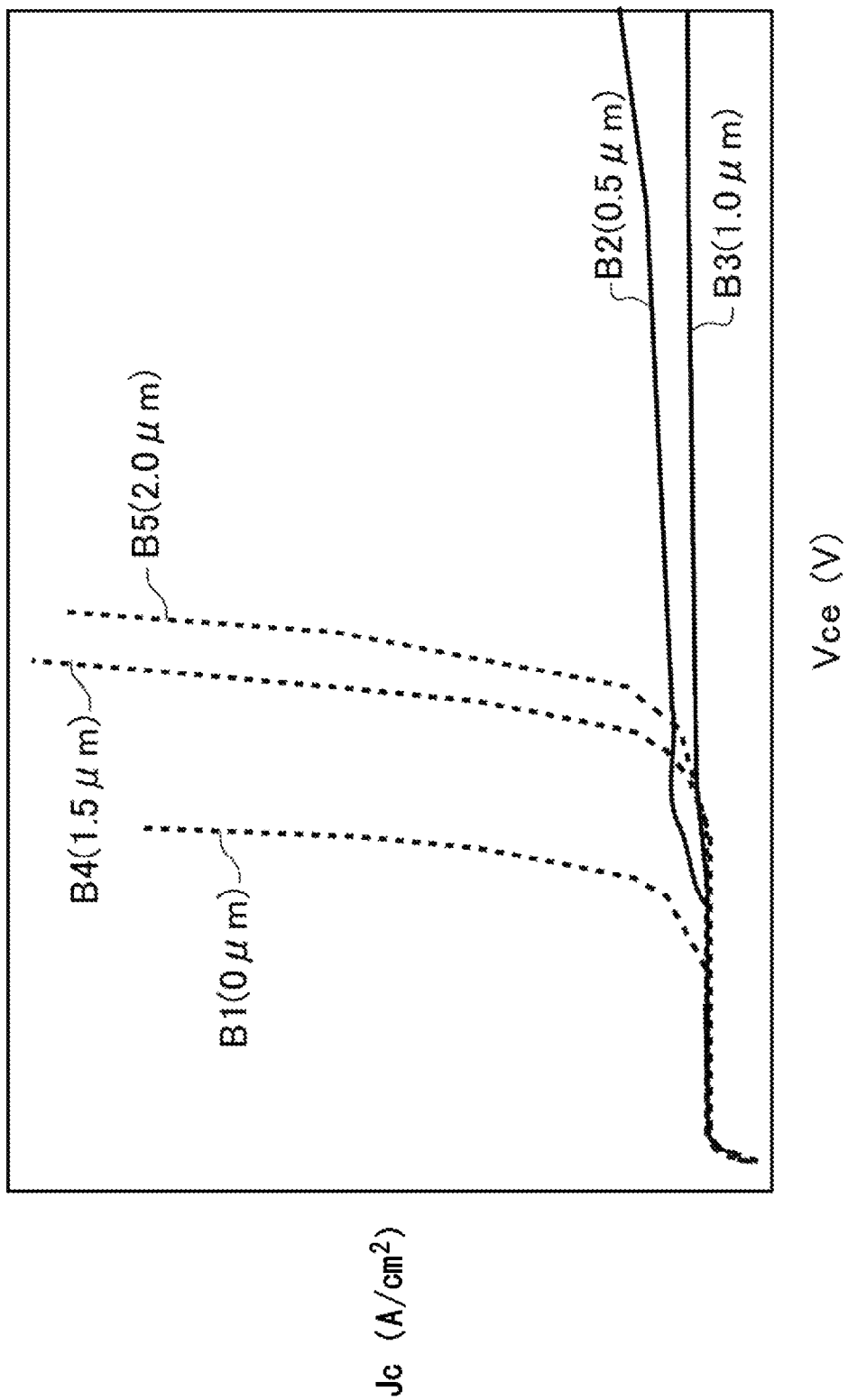
FIG. 7B shows the dependency of the saturation characteristics of the collector current Jc on the thickness of the electric-field relaxation layer 17.

FIG. 7B shows the dependency of the saturation characteristics of the collector current Jc on the thickness of the electric-field relaxation layer 17. Doping concentration distributions B1 to B5 correspond to the cases of varying the film thickness of the electric-field relaxation layer 17 as shown in FIG. 7A. The graph lines of the collector current Jc in FIG. 7B correspond to the respective cases of varying the thickness of the electric-field relaxation layer 17.

In the case of doping concentration distribution B1, the collector current Jc is not saturated. That is, if the electric-field relaxation layer 17 is not provided, a large electric field is generated between the accumulation region 16 and the base region 14 when a high voltage is applied. This causes avalanche current to be generated, so that the collector current Jc is not saturated.

In the cases of doping concentration distribution B2 and doping concentration distribution B3, the collector current Jc is saturated by virtue of the electric-field relaxation layer 17. The film thickness of the electric-field relaxation layer 17 is preferably selected within a range such that the collector current Jc is saturated.

In the cases of doping concentration distribution B4 and doping concentration distribution B5, the collector current Jc is not saturated. That is, if the thickness of the electric-field relaxation layer 17 is larger than a predetermined thickness, the electric field generated in the accumulation region 16 is not sufficiently deconcentrated. That is, a high electric field is generated at the interface between the electric-field relaxation layer 17 and the accumulation region 16, and a proportion deconcentrated to the interface between the base region 14 and the electric-field relaxation layer 17 is reduced. Thus, when a high voltage is applied, avalanche current is generated, so that the collector current Jc is not saturated.

Therefore, the electric-field relaxation layer 17 preferably has a film thickness such that the generation of avalanche current can be inhibited when a high voltage is applied. In an example, the electric-field relaxation layer 17 has a film thickness that is large at an extent that the electric field at the interface between the accumulation region 16 and the base region 14 can be sufficiently relaxed. In addition, the film thickness of the electric-field relaxation layer 17 preferably has a film thickness at an extent that the electric field generated at the interface between the base region 14 and the accumulation region 16 is sufficiently deconcentrated between the base region 14 and the accumulation region 16. For example, the film thickness of the electric-field relaxation layer 17 is set to be smaller than the film thickness of the accumulation region 16. The film thickness of the electric-field relaxation layer 17 may be 0.5 µm or more and less than 1.5 µm.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 12: emitter region, 14: base region, 16: accumulation region, 17: electric-field relaxation layer, 18: drift region, 20: buffer region, 21: upper surface, 22: collector region, 23: lower surface, 24: collector electrode, 26: interlayer dielectric film, 40: gate trench portion, 42: gate insulating film, 44: gate conductive portion, 52: emitter electrode, 100: semiconductor device, 500: semiconductor device, 512: emitter region, 514: base region, 516: accumulation region, 518: drift region

What is claimed is:
1. A semiconductor device comprising:
a first-conductivity-type drift region provided in a semiconductor substrate;
a first-conductivity-type accumulation region provided above the drift region and having a higher doping concentration than the drift region;
a second-conductivity-type base region provided above the accumulation region; and
an electric-field relaxation layer provided between the accumulation region and the base region and having a lower doping concentration than the accumulation region, wherein
a thickness of the electric-field relaxation layer is equal to or smaller than a thickness of the accumulation region.

2. The semiconductor device according to claim 1, wherein the electric-field relaxation layer comprises a first-conductivity-type region including a region having a same doping concentration as the drift region.

3. The semiconductor device according to claim 2, wherein in the electric-field relaxation layer, the region having the same doping concentration as the drift region extends over a length of 0.5 µm or more in a depth direction of the semiconductor substrate.

4. The semiconductor device according to claim 1, wherein a doping concentration of the electric-field relaxation layer is lower by one or more orders of magnitude than a peak in doping concentration of the accumulation region.

5. The semiconductor device according to claim 1, wherein a doping concentration of the electric-field relaxation layer is lower than a peak in doping concentration of the base region.

6. The semiconductor device according to claim 1, wherein the thickness of the electric-field relaxation layer is 0.5 µm or more and less than 1.5 µm.

7. A semiconductor device comprising:
a first-conductivity-type drift region provided in a semiconductor substrate;
a first-conductivity-type accumulation region provided above the drift region and having a higher doping concentration than the drift region;
a second-conductivity-type base region provided above the accumulation region; and
an electric-field relaxation layer provided between the accumulation region and the base region and having a lower doping concentration than the accumulation region,
wherein a thickness of the electric-field relaxation layer is 0.5 µm or more and less than 1.5 µm.

8. The semiconductor device according to claim 7, wherein the electric-field relaxation layer comprises a first-conductivity-type region including a region having a same doping concentration as the drift region.

9. The semiconductor device according to claim 8, wherein in the electric-field relaxation layer, the region having the same doping concentration as the drift region extends over a length of 0.5 µm or more in a depth direction of the semiconductor substrate.

10. The semiconductor device according to claim 7, wherein a doping concentration of the electric-field relaxation layer is lower by one or more orders of magnitude than a peak in doping concentration of the accumulation region.

11. The semiconductor device according to claim 7, wherein a doping concentration of the electric-field relaxation layer is lower than a peak in doping concentration of the base region.

12. The semiconductor device according to claim 7, wherein the thickness of the electric-field relaxation layer is equal to or smaller than a thickness of the accumulation region.

13. A semiconductor device comprising:
a first-conductivity-type drift region provided in a semiconductor substrate;
a first-conductivity-type accumulation region provided above the drift region and having a higher doping concentration than the drift region;

a second-conductivity-type base region provided above the accumulation region; and an electric-field relaxation layer provided between the accumulation region and the base region and having a lower doping concentration than the accumulation region, wherein a peak of a doping concentration of the accumulation region is greater than a peak of a doping concentration of the base region.

14. The semiconductor device according to claim 13, wherein the electric-field relaxation layer comprises a first-conductivity-type region including a region having a same doping concentration as the drift region.

15. The semiconductor device according to claim 14, wherein in the electric-field relaxation layer, the region having the same doping concentration as the drift region extends over a length of 0.5 μm or more in a depth direction of the semiconductor substrate.

16. The semiconductor device according to claim 13, wherein a doping concentration of the electric-field relaxation layer is lower by one or more orders of magnitude than a peak in doping concentration of the accumulation region.

17. The semiconductor device according to claim 13, wherein a doping concentration of the electric-field relaxation layer is lower than a peak in doping concentration of the base region.

18. The semiconductor device according to claim 13, wherein a thickness of the electric-field relaxation layer is equal to or smaller than a thickness of the accumulation region.

19. The semiconductor device according to claim 13, wherein a thickness of the electric-field relaxation layer is 0.5 μm or more and less than 1.5 μm.

* * * * *